United States Patent
Smorenburg et al.

(10) Patent No.: US 12,517,441 B2
(45) Date of Patent: Jan. 6, 2026

(54) CLEANING METHOD AND ASSOCIATED ILLUMINATION SOURCE METROLOGY APPARATUS

(71) Applicant: ASML Netherlands B.V., Veldhoven (NL)

(72) Inventors: Petrus Wilhelmus Smorenburg, Veldhoven (NL); Stephen Edward, Eindhoven (NL); Sjoerd Nicolaas Lambertus Donders, Vught (NL); Adrianus Johannes Hendrikus Schellekens, Oirschot (NL); David O'Dwyer, Eindhoven (NL); Andrey Nikipelov, Eindhoven (NL); Gosse Charies De Vries, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 4 days.

(21) Appl. No.: 18/286,486

(22) PCT Filed: Mar. 31, 2022

(86) PCT No.: PCT/EP2022/058586
§ 371 (c)(1),
(2) Date: Oct. 11, 2023

(87) PCT Pub. No.: WO2022/228820
PCT Pub. Date: Nov. 3, 2022

(65) Prior Publication Data
US 2024/0377765 A1    Nov. 14, 2024

(30) Foreign Application Priority Data

Apr. 26, 2021 (EP) ................................ 21170472
Oct. 25, 2021 (EP) ................................ 21204494

(51) Int. Cl.
*G03F 7/00* (2006.01)
*G02F 1/35* (2006.01)

(52) U.S. Cl.
CPC ........ *G03F 7/70925* (2013.01); *G02F 1/3505* (2021.01); *G02F 1/353* (2013.01); *G03F 7/70008* (2013.01)

(58) Field of Classification Search
CPC ............. G03F 7/70008; G03F 7/70616; G03F 7/70925; G02F 1/3501; G02F 1/3505;
(Continued)

(56) References Cited

U.S. PATENT DOCUMENTS 6,952,253 B2    10/2005    Lof et al.
7,154,582 B2    12/2006    Ohsaki
(Continued)

FOREIGN PATENT DOCUMENTS

CN    101515105 B    7/2010
EP      1628164 A2    2/2006
(Continued)

OTHER PUBLICATIONS

International Search Report and Written Opinion of the International Searching Authority directed to International Patent Application No. PCT/EP2022/058586, mailed Jul. 29, 2022; 11 pages.
(Continued)

*Primary Examiner* — Deoram Persaud
(74) *Attorney, Agent, or Firm* — Sterne, Kessler, Goldstein & Fox P.L.L.C.

(57) ABSTRACT

An assembly comprises a space configured for placing a medium to receive a first radiation for generating a second radiation. In operation, the second radiation propagates coaxially with the first radiation after the medium. The assembly further comprises an optical element after the medium for transmitting or reflecting the first radiation with
(Continued)

a surface area. The assembly is configured such that, in operation, a cleaning gas is in contact with the surface area. A reactive medium is generated from at least a part of the cleaning gas by the second radiation for removing a contamination from the surface area.

15 Claims, 6 Drawing Sheets

(58) Field of Classification Search
CPC ........ G02F 1/353; G02F 1/3528; G02F 1/354; G02F 2203/26
See application file for complete search history.

(56) References Cited

U.S. PATENT DOCUMENTS

| | | | |
|---|---|---|---|
| 7,671,347 B2 | 3/2010 | Ehm et al. | |
| 7,701,577 B2 | 4/2010 | Straaijer et al. | |
| 7,791,724 B2 | 9/2010 | Den Boef et al. | |
| 7,948,673 B2 | 5/2011 | Yoshimura et al. | |
| 8,115,926 B2 | 2/2012 | Straaijer | |
| 8,553,227 B2 | 10/2013 | Jordanoska | |
| 8,681,312 B2 | 3/2014 | Straaijer | |
| 8,692,994 B2 | 4/2014 | Straaijer | |
| 8,792,096 B2 | 7/2014 | Straaijer | |
| 8,797,554 B2 | 8/2014 | Straaijer | |
| 8,823,922 B2 | 9/2014 | Den Boef | |
| 2002/0109826 A1 | 8/2002 | Akagawa et al. | |
| 2003/0210458 A1 | 11/2003 | Luedecke et al. | |
| 2006/0066855 A1 | 3/2006 | Boef et al. | |
| 2006/0091109 A1 | 5/2006 | Partlo et al. | |
| 2006/0189017 A1 | 8/2006 | Nogami | |
| 2007/0056941 A1 | 3/2007 | Murase et al. | |
| 2007/0069162 A1* | 3/2007 | Banine | G03B 7/20 250/504 R |
| 2007/0224518 A1 | 9/2007 | Yokhin et al. | |
| 2008/0092648 A1* | 4/2008 | Zhou | G01N 21/3554 73/335.01 |
| 2008/0218709 A1* | 9/2008 | Van Vliet | B08B 3/12 355/30 |
| 2009/0074962 A1* | 3/2009 | Wilhelmus Van Herpen | C23C 16/0236 427/250 |
| 2010/0192973 A1 | 8/2010 | Ueno et al. | |
| 2010/0328655 A1 | 12/2010 | Den Boef | |
| 2011/0026032 A1 | 2/2011 | Den Boef et al. | |
| 2011/0102753 A1 | 5/2011 | Van De Kerkhof et al. | |
| 2011/0249244 A1 | 10/2011 | Leewis et al. | |
| 2012/0044470 A1 | 2/2012 | Smilde et al. | |
| 2012/0049151 A1 | 3/2012 | Zhang et al. | |
| 2013/0162996 A1 | 6/2013 | Straaljer et al. | |
| 2013/0304424 A1 | 11/2013 | Bakeman et al. | |
| 2014/0019097 A1 | 1/2014 | Bakeman et al. | |
| 2014/0110609 A1 | 4/2014 | Bykanov et al. | |
| 2014/0146838 A1 | 5/2014 | Germanenko et al. | |
| 2016/0161863 A1 | 6/2016 | Den Boef et al. | |
| 2016/0282282 A1 | 9/2016 | Quintanilha et al. | |
| 2016/0370717 A1 | 12/2016 | Den Boef et al. | |
| 2017/0184981 A1 | 6/2017 | Quintanilha et al. | |
| 2019/0003988 A1 | 1/2019 | Solarz et al. | |
| 2019/0215940 A1 | 7/2019 | Khodykin et al. | |
| 2021/0033836 A1 | 2/2021 | Yuste et al. | |
| 2023/0008231 A1* | 1/2023 | Lancuba | G01J 3/0208 |

FOREIGN PATENT DOCUMENTS

| | | |
|---|---|---|
| JP | 2012049501 A | 3/2012 |
| KR | 100583506 B1 | 5/2006 |
| TW | 200831182 A | 8/2008 |
| WO | 2011012624 A1 | 2/2011 |

OTHER PUBLICATIONS

International Preliminary Report on Patentability directed to International Patent Application No. PCT/EP2022/058586, issued Oct. 24, 2023; 7 pages.

"Cold Finger—Getter Cold Finger Overview," retrieved on Nov. 9, 2023 from https://abbess.com/cold-finger/; 9 pages.

Ganeev et al., "Third-harmonic generation in air by use of femtosecond radiation in tight-focusing conditions," Applied Optics, vol. 45, No. 4, Feb. 1, 2006, pp. 748-755.

Lehmeier et al., "Nonresonant Third Order Hyperpolarizability of Rare Gases and N2 Determined by Third Harmonic Generation," Optics and Communications, vol. 56, No. 1, Nov. 1, 1985; pp. 67-72.

Lemaillet et al., "Intercomparison between optical and x-ray scatterometry measurements of FinFET structures," Proc. SPIE, vol. 8681, Metrology, Inspection, and Process Control for Microlithography XXVII, Apr. 2013; 8 pages.

Niu et al., "Specular Spectroscopic Scatterometry in DUV Lithography," Proc. SPIE, vol. 3677, Metrology, Inspection, and Process Control for Microlithography XIII, Jun. 14, 1999; 10 pages.

Galli et al., "Generation of deep ultraviolet sub-2-fs pulses," Optical Society of America, Optics Letters, vol. 44, No. 6, Mar. 15, 2019; pp. 1308-1311.

Hubka et al., "Mitigation of laser-induced contamination in vacuum in high-repetition-rate high-peak-power laser systems," Optical Society of America, Applied Optics, vol. 60, No. 3, Jan. 20, 2021; pp. 533-538.

Ueffing et al., "Nonlinear pulse compression in a gas-filled multipass cell," Optical Society of America, Optics Letters, vol. 43, No. 9, May 1, 2018; pp. 2070-2073.

Russbueldt et al., "Scalable 30 fs laser source with 530 W average power," Optical Society of America, Optics Letters, vol. 44, No. 21, Nov. 1, 2019; pp. 5222-5225.

Bartels et al., "Removal of laser-induced contamination on ALADIN laser optics by UV/ozone cleaning," Proc. SPIE, vol. 11173, Laser-induced Damage in Optical Materials, Nov. 20, 2019; 10 pages.

* cited by examiner

CLEANING METHOD AND ASSOCIATED ILLUMINATION SOURCE METROLOGY APPARATUS

CROSS REFERENCE TO RELATED APPLICATIONS

This application claims priority of EP application Ser. No. 21170472.1 which was filed on 2021 Apr. 26 and of EP application Ser. No. 21204494.5 which was filed on 2021 Oct. 25 and whom are incorporated herein in their entirety by reference.

FIELD

The present invention relates to a cleaning method and associated illumination source metrology apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field.

Examples of known scatterometers often rely on provision of dedicated metrology targets. For example, a method may require a target in the form of a simple grating that is large enough that a measurement beam generates a spot that is smaller than the grating (i.e., the grating is underfilled). In so-called reconstruction methods, properties of the grating can be calculated by simulating interaction of scattered radiation with a mathematical model of the target structure. Parameters of the model are adjusted until the simulated interaction produces a diffraction pattern similar to that observed from the real target.

In addition to measurement of feature shapes by reconstruction, diffraction-based overlay can be measured using such apparatus, as described in published patent application US2006066855A1. Diffraction-based overlay metrology using dark-field imaging of the diffraction orders enables overlay measurements on smaller targets. These targets can be smaller than the illumination spot and may be surrounded by product structures on a wafer. Examples of dark field imaging metrology can be found in numerous published patent applications, such as for example US2011102753A1 and US20120044470A. Multiple gratings can be measured in one image, using a composite grating target. The known scatterometers tend to use light in the visible or near-infrared (IR) wave range, which requires the pitch of the grating to be much coarser than the actual product structures whose properties are actually of interest. Such product features may be defined using deep ultraviolet (DUV), extreme ultraviolet (EUV) or X-ray radiation having far shorter wavelengths. Unfortunately, such wavelengths are not normally available or usable for metrology.

On the other hand, the dimensions of modern product structures are so small that they cannot be imaged by optical metrology techniques. Small features include for example those formed by multiple patterning processes, and/or pitch-multiplication. Hence, targets used for high-volume metrology often use features that are much larger than the products whose overlay errors or critical dimensions are the property of interest. The measurement results are only indirectly related to the dimensions of the real product structures, and may be inaccurate because the metrology target does not suffer the same distortions under optical projection in the lithographic apparatus, and/or different processing in other steps of the manufacturing process. While scanning electron microscopy (SEM) is able to resolve these modern product structures directly, SEM is much more time consuming than optical measurements. Moreover, electrons are not able to penetrate through thick process layers, which makes them less suitable for metrology applications. Other techniques, such as measuring electrical properties using contact pads is also known, but it provides only indirect evidence of the true product structure.

By decreasing the wavelength of the radiation used during metrology it is possible to resolve smaller structures, to increase sensitivity to structural variations of the structures and/or penetrate further into the product structures. One such method of generating suitably high frequency radiation (e.g. hard X-ray, soft X-ray and/or EUV radiation) may be using a pump radiation (e.g., infrared IR radiation) to excite a generating medium, thereby generating an emitted radiation, optionally a high harmonic generation comprising high frequency radiation.

SUMMARY

In a first aspect of the invention, there is provided an assembly comprises a space configured for placing a medium to receive a first radiation for generating a second radiation. In operation, the second radiation propagates coaxially with the first radiation after the medium. The assembly further comprises an optical element after the medium for transmitting or reflecting the first radiation with a surface area. The assembly is configured such that, in operation, a cleaning gas is in contact with the surface area. A reactive medium is generated from at least a part of the cleaning gas by the second radiation for removing a contamination from the surface area.

In a second aspect of the invention, there is provided a radiation source comprising an assembly as described above.

In a third aspect of the invention, there is provided a lithographic apparatus comprising a radiation source as described above.

In a fourth aspect of the invention, there is provided a metrology apparatus comprising a radiation source as described above.

In a fifth aspect of the invention, there is provided a lithographic cell comprising a radiation source as described above.

In a sixth aspect of the invention, there is provided a method comprising inputting a first radiation into a medium to generate a second radiation such that the second radiation propagates coaxially with the first radiation after the medium and impinges onto a surface area of an optical element after the medium, wherein the surface area of the optical element transmits or reflects the first radiation, providing a cleaning gas in contact with the surface area, and generating a reactive medium from at least a part of the cleaning gas by the second radiation for removing a contamination from the surface area.

In a seventh aspect of the invention, there is provided a non-transitory computer program product comprising machine-readable instructions therein, the instructions, upon execution by a computer system, configured to cause the computer system to at least cause performance of the method as described above.

BRIEF DESCRIPTION OF THE DRAWINGS

Embodiments will now be described, by way of example only, with reference to the accompanying schematic drawings, in which.

DETAILED DESCRIPTION

In the present document, the terms "radiation" and "beam" are used to encompass all types of electromagnetic radiation and particle radiation, including ultraviolet radiation (e.g. with a wavelength of 365, 248, 193, 157 or 126 nm), EUV (extreme ultra-violet radiation, e.g. having a wavelength in the range of about 5-100 nm), X-ray radiation, electron beam radiation and other particle radiation.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
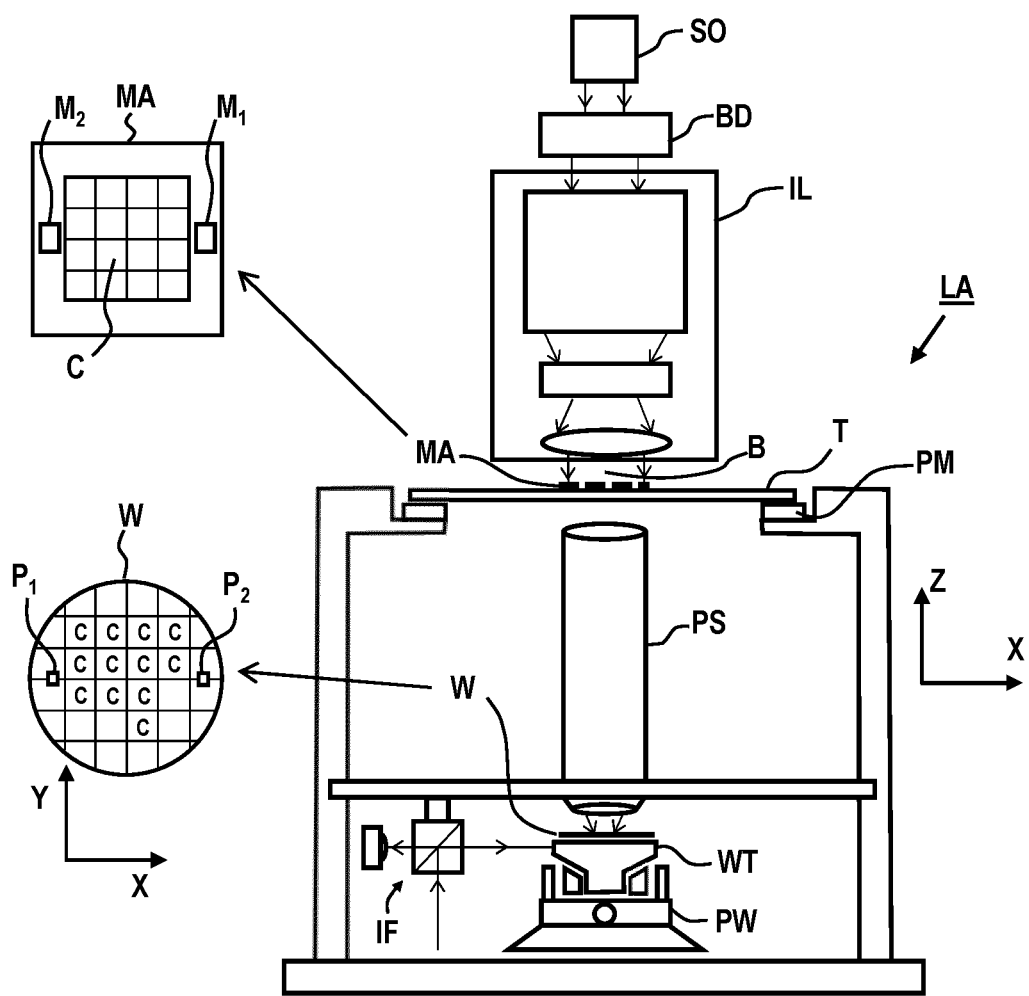
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., ultraviolet UV radiation, DUV radiation, EUV radiation or X-ray radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, diffractive, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, diffractive, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference in its entirety.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT may be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
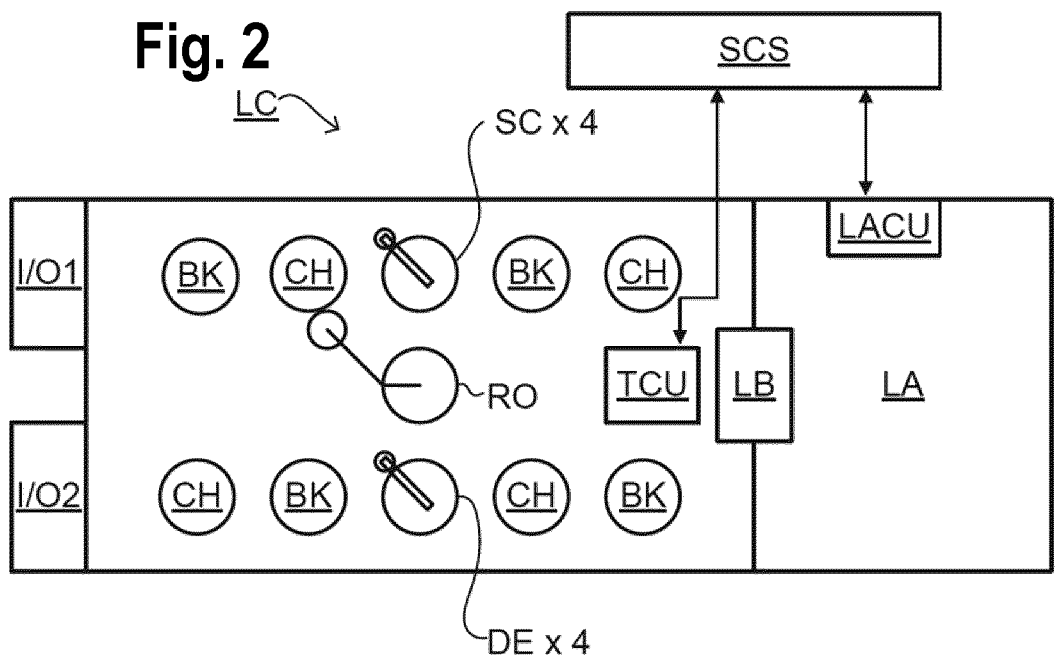
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, may be under the control of a track control unit TCU that in itself may be controlled by a supervisory control system SCS, which may also control the lithographic apparatus LA, e.g. via lithography control unit LACU.

In lithographic processes, it is desirable to make frequently measurements of the structures created, e.g., for process control and verification. Tools to make such measurement may be called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in or close to the pupil or a conjugate plane with the pupil of the objective of the scatterometer, measurements usually referred as pupil based measurements, or by having the sensor in or close to an image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from hard X-ray (HXR), soft X-ray (SXR), extreme ultraviolet (EUV), visible to near-infrared (IR) and IR wavelength range. In case that the radiation is hard X-ray or soft X-ray, the aforementioned scatterometers may optionally be a small-angle X-ray scattering metrology tool.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), shape of structures, etc. For this purpose, inspection tools and/or metrology tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected, transmitted or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered or transmitted radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920, 968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (maybe overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. The pitch and line-width of the structures in the gratings may strongly depend on the measurement optics (in particular the NA of the measurement optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figure 3:
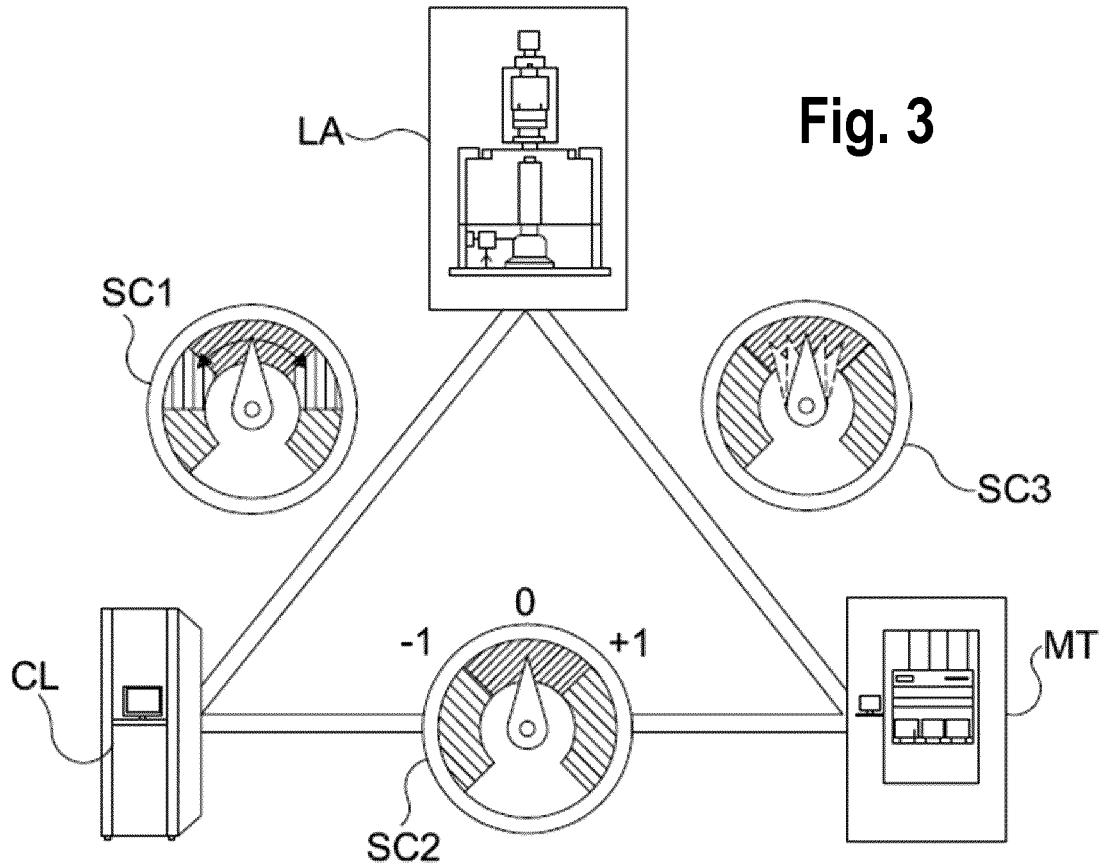
FIG. 3 depicts a schematic representation of holistic lithography, representing a cooperation between three key technologies to optimize semiconductor manufacturing.

The patterning process in a lithographic apparatus LA may be one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—maybe within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). The resolution enhancement techniques may be arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

Many different forms of metrology tools MT for measuring structures created using lithographic patterning apparatus can be provided. Metrology tools MT may use electromagnetic radiation to interrogate a structure. Properties of the radiation (e.g. wavelength, bandwidth, power) can affect different measurement characteristics of the tool, with shorter wavelengths generally allowing for increased resolution. Radiation wavelength has an effect on the resolution the metrology tool can achieve. Therefore, in order to be able to measure structures with features having small dimensions, metrology tools MT with short wavelength radiation sources are preferred.

Another way in which radiation wavelength can affect measurement characteristics is penetration depth, and the transparency/opacity of materials to be inspected at the radiation wavelength. Depending on the opacity and/or penetration depth, radiation can be used for measurements in transmission or reflection. The type of measurement can affect whether information is obtained about the surface and/or the bulk interior of a structure/substrate. Therefore, penetration depth and opacity are another element to be taken into account when selecting radiation wavelength for a metrology tool.

In order to achieve higher resolution for measurement of lithographically patterned structures, metrology tools MT with short wavelengths are preferred. This may include wavelengths shorter than visible wavelengths, for example in the UV, EUV, and X-ray portions of the electromagnetic spectrum. Hard X-ray methods such as Transmitted Small Angle X-ray Scattering (TSAXS) make use of the high resolution and high penetration depth of hard X-rays and may therefore operate in transmission. Soft X-rays and EUV, on the other hand, do not penetrate the target as far but may induce a rich optical response in the material to be probed. This may be due the optical properties of many semiconductor materials, and due to the structures being comparable in size to the probing wavelength. As a result, EUV and/or soft X-ray metrology tools MT may operate in reflection, for example by imaging, or by analysing diffraction patterns from, a lithographically patterned structure.

For hard X-ray, soft X-ray and EUV radiations, applications in high volume manufacturing (HVM) applications may be limited due to a lack of available high-brilliance radiation sources at the required wavelengths. In the case of hard X-rays, commonly used sources in industrial applications include X-ray tubes. X-ray tubes, including advanced X-ray tubes for example based on liquid metal anodes or rotating anodes, may be relatively affordable and compact, but may lack brilliance required for HVM applications. High brilliance X-ray sources such as Synchrotron Light Sources (SLSs) and X-ray Free Electron Lasers (XFELs) currently exist, but their size (>100 m) and high cost (multi-100-million euro), makes them prohibitively large and expensive for metrology applications. Similarly, there is a lack of availability of sufficiently bright EUV and soft X-ray radiation sources.

Figure 4:
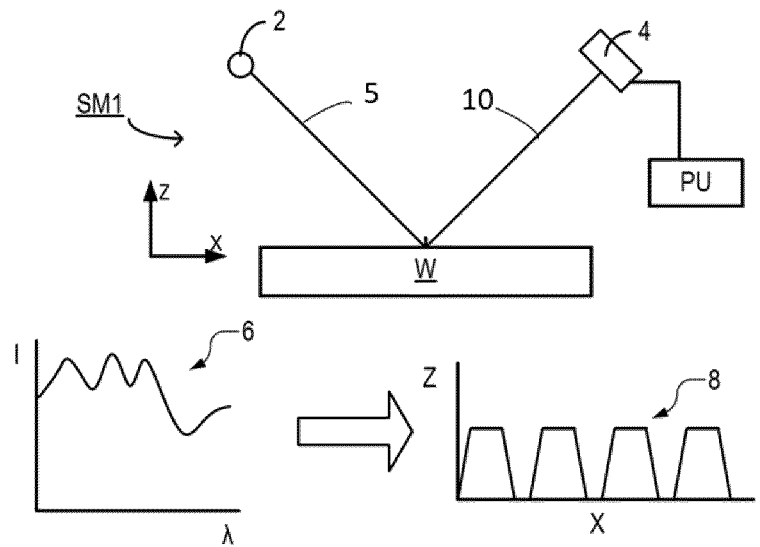
FIG. 4 schematically illustrates a scatterometry apparatus.

One example of a metrology apparatus, such as a scatterometer, is depicted in FIG. 4. It may comprise a broadband (e.g. white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength $\lambda$) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 5:
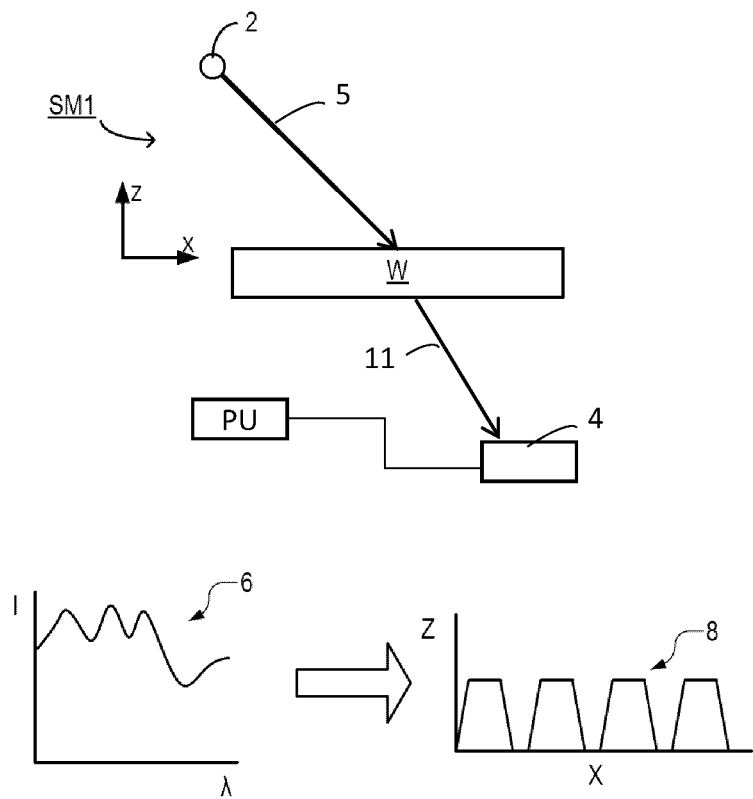
FIG. 5 schematically illustrates a transmissive scatterometry apparatus.

A transmissive version of the example of a metrology apparatus, such as a scatterometer shown in FIG. 4, is depicted in FIG. 5. The transmitted radiation 11 is passed to a spectrometer detector 4, which measures a spectrum 6 as discussed for FIG. 4. Such a scatterometer may be configured as a normal-incidence scatterometer or an oblique-incidence scatterometer. Optionally, the transmissive version using hard X-ray radiation with wavelength <1 nm, optionally <0.1 nm, optionally <0.01 nm.

As an alternative to optical metrology methods, it has also been considered to use hard X-ray, soft X-rays or EUV radiation, for example radiation with at least one of the wavelength ranges: <0.01 nm, <0.1 nm, <1 nm, between 0.01 nm and 100 nm, between 0.01 nm and 50 nm, between 1 nm and 50 nm, between 1 nm and 20 nm, between 5 nm and 20 nm, and between 10 nm and 20 nm. One example of metrology tool functioning in one of the above presented wavelength ranges is transmissive small angle X-ray scattering (T-SAXS as in US2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. It is noted that the use of laser produced plasma (LPP) x-ray source is described in U.S. Patent Publication No. 2019/003988A1, and in U.S. Patent Publication No. 2019/215940A1, which are incorporated herein by reference in the entirety. Reflectometry techniques using X-rays (GI-XRS) and extreme ultraviolet (EUV) radiation at grazing incidence may be used for measuring properties of films and stacks of layers on a substrate. Within the general field of reflectometry, goniometric and/or spectroscopic techniques may be applied. In goniometry, the variation of a reflected beam with different incidence angles may be measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in e.g. the hard-X-rays, soft X-rays or EUV domain not sufficient. Published patent applications US20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The contents of the cited US patent applications are incorporated herein by reference in their entirety.

Figure 6:
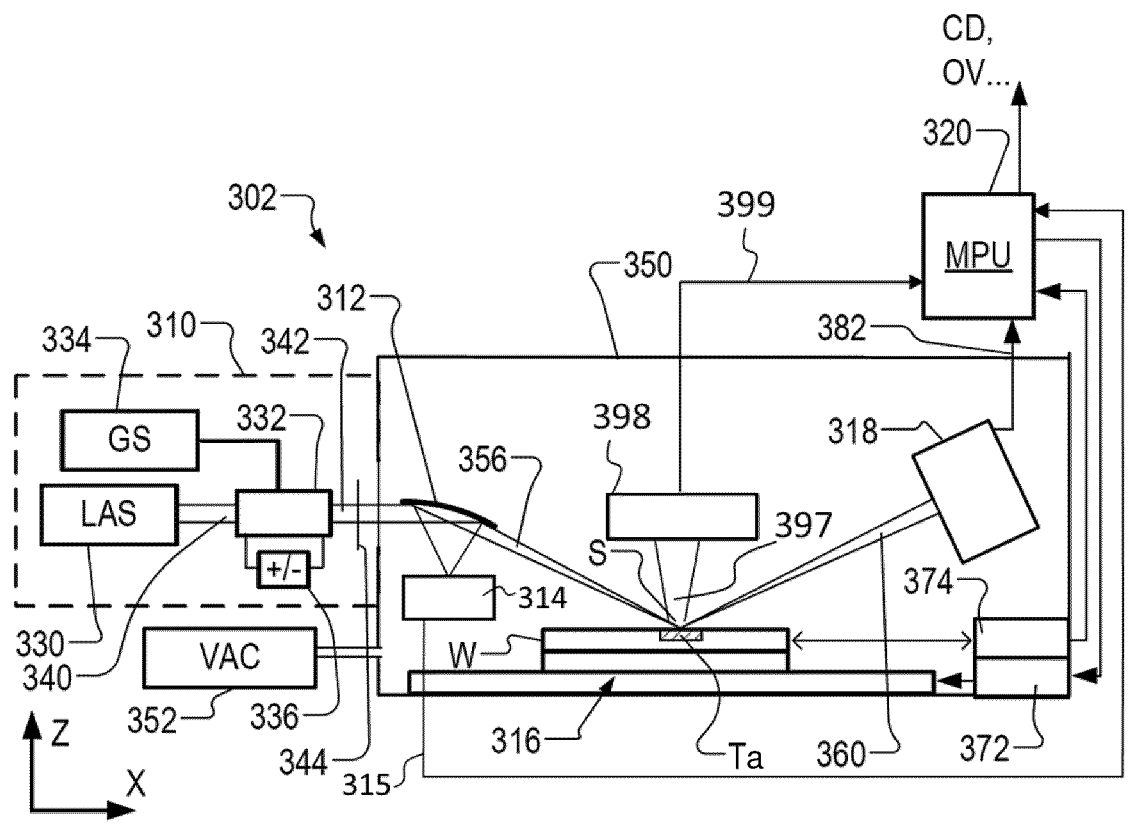
FIG. 6 depicts a schematic representation of a metrology apparatus in which EUV and/or SXR radiation is used.

FIG. 6 depicts a schematic representation of a metrology apparatus 302 in which the aforementioned radiation may be used to measure parameters of structures on a substrate. The metrology apparatus 302 presented in FIG. 6 may be suitable for the hard X-ray, soft X-rays and/or EUV domain.

FIG. 6 illustrates a schematic physical arrangement of a metrology apparatus 302 comprising a spectroscopic scatterometer using hard X-ray, Soft X-Ray and/or EUV radiation optionally in grazing incidence, purely by way of example. An alternative form of inspection apparatus might be provided in the form of an angle-resolved scatterometer, which may use radiation in normal or near-normal incidence similar to the conventional scatterometers operating at longer wavelengths, and which may also use radiation with direction being greater than 1° or 2° from a direction parallel to the substrate. An alternative form of inspection apparatus might be provided in the form of a transmissive scatterometer, to which the configuration in FIG. 5 applies.

Inspection apparatus 302 comprises a radiation source or called illumination source 310, illumination system 312, substrate support 316, detection systems 318, 398 and metrology processing unit (MPU) 320.

An illumination source 310 in this example is for a generation of EUV, hard X-ray or soft X-ray radiation. The illumination source 310 may be based on high harmonic generation (HHG) techniques as shown in FIG. 6, and it may also be other types of illumination sources, e.g. liquid metal jet source, inverse Compton scattering (ICS) source, plasma channel source, magnetic undulator source, free electron laser (FEL) source, compact storage ring source, electrical discharge produced plasma source, soft X-ray laser source, rotating anode source, solid anode source, particle accelerator source, microfocus source, or laser produced plasma source.

The HHG source may be a gas jet/nozzle source, a capillary/fiber source or a gas cell source.

For the example of HHG source, as shown in FIG. 6, main components of the radiation source are a pump radiation source 330 operable to emit the pump radiation and a gas delivery system 332. Optionally the pump radiation source 330 is a laser, optionally the pump radiation source 330 is a pulsed high-power infrared or optical laser. The pump radiation source 330 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). Optionally, the laser pulses are delivered as a first pump radiation 340 to the gas delivery system 332, where in the gas a portion of the radiation is converted to higher frequencies than the first pump radiation into an emitted radiation 342. A gas supply 334 supplies a suitable gas to the gas delivery system 332, where it is optionally ionized by an electric source 336. The gas delivery system 332 may be a cut tube.

A gas provided by the gas delivery system 332 defines a gas target, which may be a gas flow or a static volume. The gas may be for example a noble gas, optionally comprises one or more of Neon (Ne), Helium (He), Argon (Ar), Nitrogen ($N_2$), Oxygen ($O_2$), Krypton (Kr), and Xenon (Xe). These may be selectable options within the same apparatus. The emitted radiation may contain multiple wavelengths. If the emitted radiation were monochromatic, then measurement calculations (for example reconstruction) may be simplified, but it is easier to produce radiation with several wavelengths. An emission divergence angle of the emitted radiation may be wavelength dependent. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) or Zirconium (Zr) may serve to cut the fundamental IR radiation from passing further into the inspection apparatus. A grating (not shown) may be provided to select one or more specific wavelengths from among those generated. Optionally the illumination source comprises a space that is configured to be evacuated and the gas delivery system is configured to provide a gas target in the space. Optionally some or all of the beam path may be contained within a vacuum environment, bearing in mind that SXR and/or EUV radiation is absorbed when traveling in air. The various components of radiation source 310 and illumination optics 312 may be adjustable to implement different metrology 'recipes' within the same apparatus. For example different wavelengths and/or polarization may be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 0.01-20 nm or optionally in the range 1-10 nm or optionally in the range 10-20 nm may be chosen. Wavelengths shorter than 5 nm may suffer from very low critical angle when reflecting off materials of interest in semiconductor manufacture. Therefore to choose a wavelength greater than 5 nm may provide stronger signals at higher angles of incidence. On the other hand, if the inspection task is for detecting the presence of a certain material, for example to detect contamination, then wavelengths up to 50 nm could be useful.

From the radiation source 310, the filtered beam 342 may enter an inspection chamber 350 where the substrate W including a structure of interest is held for inspection at a measurement position by substrate support 316. The structure of interest is labeled T. Optionally the atmosphere within inspection chamber 350 may be maintained near vacuum by vacuum pump 352, so that SXR and/or EUV radiation may pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing is performed to achieve a round or elliptical spot S under 10 μm in diameter, when projected onto the structure of interest. Substrate support 316 comprises for example an X-Y translation stage and a rotation stage, by which any part of the substrate W may be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise a hard X-ray, soft X-ray and/or EUV spectroscopic reflectometer of the kind described in US2016282282A1 which content is incorporated herein by reference in its entirety.

If the target Ta has a certain periodicity, the radiation of the focused beam 356 may be partially diffracted as well. The diffracted radiation 397 follows another path at well-defined angles with respect to the angle of incidence then the reflected radiation 360. In FIG. 6, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 6 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target Ta are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 may also communicate with a position controller 372 which operates the translation stage, rotation and/or tilting stages. Processor 320 receives highly accurate feedback on the position and orientation of the substrate, via sensors. Sensors 374 may include interferometers, for example, which may give accuracy in the region of picometers. In the operation of the inspection apparatus 302, spectrum data 382 captured by detection system 318 is delivered to metrology processing unit 320.

As mentioned an alternative form of inspection apparatus uses hard X-ray, soft X-ray and/or EUV radiation optionally at normal incidence or near-normal incidence, for example to perform diffraction-based measurements of asymmetry. Another alternative form of inspection apparatus uses hard X-ray, soft X-ray and/or EUV radiation with direction being greater than 1° or 2° from a direction parallel to the substrate. Both types of inspection apparatus could be provided in a hybrid metrology system. Performance parameters to be measured may include overlay (OVL), critical dimension (CD), focus of the lithography apparatus while the lithography apparatus printed the target structure, coherent diffraction imaging (CDI) and at-resolution overlay (ARO) metrology. The hard X-ray, soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 may be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

Metrology tools MT, including but not limited to the scatterometers mentioned above, may use radiation from a radiation source to perform a measurement. The radiation used by a metrology tool MT may be electromagnetic radiation. The radiation may be optical radiation, for example radiation in the infrared, visible, and/or ultraviolet parts of the electromagnetic spectrum. Metrology tools MT may use radiation to measure or inspect properties and aspects of a substrate, for example a lithographically exposed pattern on a semiconductor substrate. The type and quality of the measurement may depend on several properties of the radiation used by the metrology tool MT. For example, the resolution of an electromagnetic measurement may depend on the wavelength of the radiation, with smaller wavelengths able to measure smaller features, e.g. due to the diffraction limit. In order to measure features with small dimensions, it may be preferable to use radiation with a short wavelength, for example EUV, hard X-ray (HXR) and/or Soft X-Ray (SXR) radiation, to perform measurements. In order to perform metrology at a particular wavelength or wavelength range, the metrology tool MT requires access to a source providing radiation at that/those wavelength(s). Different types of sources exist for providing different wavelengths of radiation. Depending on the wavelength(s) provided by a source, different types of radiation generation methods may be used. For extreme ultraviolet (EUV) radiation (e.g. 1 nm to 100 nm), and/or soft X-ray (SXR) radiation (e.g. 0.1 nm to 10 nm), a source may use High Harmonic Generation (HHG) or inverse Compton scattering (ICS) to obtain radiation at the desired wavelength(s).

Figure 7:
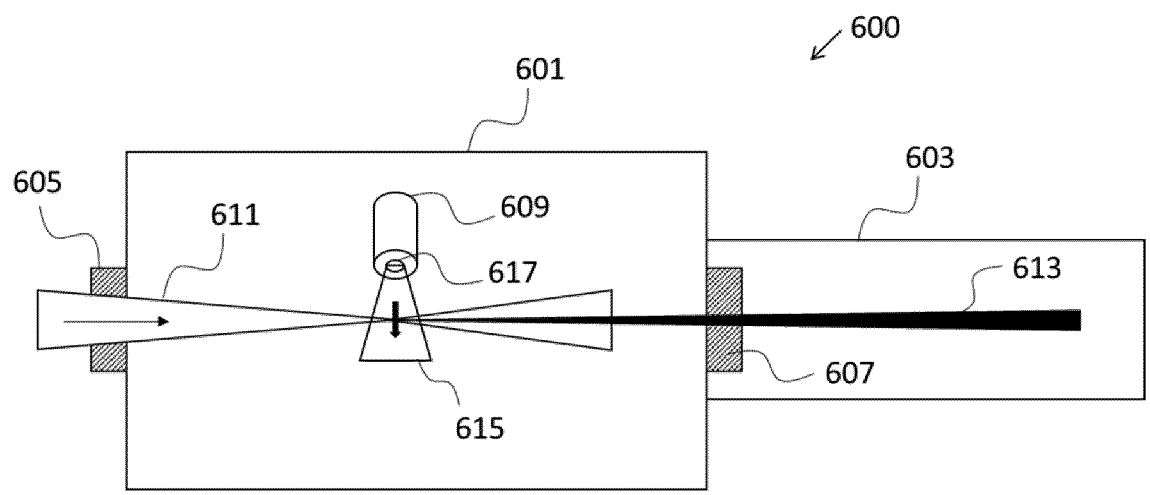
FIG. 7 depicts a simplified schematic drawing of an illumination source.

FIG. 7 shows a simplified schematic drawing of an embodiment 600 of an illumination source 310, which may be the illumination source for high harmonic generation (HHG). One or more of the features of the illumination source in the metrology tool described with respect to FIG. 6 may also be present in the illumination source 600 as appropriate. The illumination source 600 comprises a chamber 601 and is configured to receive a pump radiation 611 with a propagation direction which is indicated by an arrow. The pump radiation 611 shown here is an example of the pump radiation 340 from the pump radiation source 330, as shown in FIG. 6. The pump radiation 611 may be directed into the chamber 601 through the radiation input 605, which maybe a viewport, optionally made of fused silica or a comparable material. The pump radiation 611 may have a Gaussian or hollow, for example annular, transversal cross-sectional profile and may be incident, optionally focused, on a gas flow 615, which has a flow direction indicated by a second arrow, within the chamber 601. The gas flow 615 comprises a small volume called gas volume or gas target (for example several cubic mm) of a particular gas (e.g., a noble gas, optionally Helium, Argon, Xenon, or Neon, nitrogen, oxygen or carbon dioxide) in which the gas pressure is above a certain value. The gas flow 615 may be a steady flow. Other media, such as metallic plasmas (e.g. aluminium plasma) may also be used.

The gas delivery system of the illumination source 600 is configured to provide the gas flow 615. The illumination source 600 is configured to provide the pump radiation 611 in the gas flow 615 to drive the generation of emitted radiation 613. The region where at least a majority of the emitted radiation 613 is generated is called an interaction region. The interaction region may vary from several tens of micrometers (for tightly focused pump radiation) to several mm or cm (for moderately focused pump radiation) or even up to a few meters (for extremely loosely focused pump radiation). The gas delivery system is configured to provide the gas target for generating the emitted radiation at the interaction region of the gas target, and optionally the illumination source is configured to receive the pump radiation and to provide the pump radiation at the interactive region. Optionally, the gas flow 615 is provided by the gas delivery system into an evacuated or nearly evacuated space. The gas delivery system may comprise a gas nozzle 609, as shown in FIG. 6, which comprises an opening 617 in an exit plane of the gas nozzle 609. The gas flow 615 is provided from the opening 617. In almost all the prior arts, the gas nozzle has a cut tube geometry shape which is a uniform cylinder interior geometry shape, and the shape of the opening in the exit plane is round. An elongated opening has also been used as described in the patent application CN101515105B.

The dimensions of the gas nozzle 609 may conceivably also be used in scaled-up or scaled-down versions ranging from micrometer-sized nozzles to meter-sized nozzles. This wide range of dimensioning comes from the fact that the setup may be scaled such that the intensity of the pump radiation at the gas flow ends up in the particular range which may be beneficial for the emitted radiation, which requires different dimensioning for different pump radiation energies, which may be a pulse laser and pulse energies can vary from tens of microjoules to joules. Optionally, the gas nozzle 609 has a thicker wall to reduce nozzle deformation caused by the thermal expansion effect, which may be detected by e.g. a camera. The gas nozzle with thicker wall may produce a stable gas volume with reduced variation. Optionally, the illumination source comprises a gas catcher which is close to the gas nozzle to maintain the pressure of the chamber 601.

Due to interaction of the pump radiation 611 with the gas atoms of the gas flow 615, the gas flow 615 will convert part of the pump radiation 611 into the emitted radiation 613, which may be an example of the emitted radiation 342 shown in FIG. 6. The central axes of the emitted radiation 613 may be collinear with the central axes of the incident pump radiation 611. The emitted radiation 613 may have a wavelength in X-ray or EUV range, wherein the wavelength is in a range from 0.01 nm to 100 nm, optionally from 0.1 nm to 100 nm, optionally from 1 nm to 100 nm, optionally from 1 nm to 50 nm, or optionally from 10 nm to 20 nm.

In operation the emitted radiation 613 beam may pass through a radiation output 607 and may be subsequently manipulated and directed by an illumination system 603, which may be an example of the illumination system 312 in FIG. 6, to a substrate to be inspected for metrology measurements. The emitted radiation 613 may be guided, optionally focused, to a structure on the substrate.

Because air (and in fact any gas) heavily absorbs SXR or EUV radiation, the volume between the gas flow 615 and the wafer to be inspected may be evacuated or nearly evacuated. Since the central axes of the emitted radiation 613 may be collinear with the central axes of the incident pump radiation 611, the pump radiation 611 may need to be blocked to prevent it passing through the radiation output 607 and entering the illumination system 603. This may be done by incorporating a filtering device 344 shown in FIG. 6 into the radiation output 607, which is placed in the emitted beam path and that is opaque or nearly opaque to the pump radiation (e.g. opaque or nearly opaque to infrared or visible light) but at least partially transparent to the emitted radiation beam. The filter may be manufactured using zirconium or multiple materials combined in multiple layers. The filter may be a hollow, optionally an annular, block when the pump radiation 611 has a hollow, optionally an annular, transversal cross-sectional profile. Optionally, the filter is non-perpendicular and non-parallel to propagation direction of the emitted radiation beam to have efficient pump radiation filtering. Optionally, the filtering device 344 comprise a hollow block and a thin membrane filter such as an Aluminum (Al) or Zirconium (Zr) membrane filter. Optionally, the filtering device 344 may also comprise mirrors that efficiently reflect the emitted radiation but poorly reflect the pump radiation, or comprise a wire mesh that efficiently transmits the emitted radiation but poorly transmits the pump radiation.

Described herein are methods, apparatuses, and assemblies to obtain emitted radiation optionally at a high harmonic frequency of pump radiation. The radiation generated through the process, optionally the HHG which uses non-linear effects to generate radiation optionally at a harmonic frequency of provided pump radiation, may be provided as radiation in metrology tools MT for inspection and/or measurement of substrates. If the pump radiation comprises short pulses (i.e. few-cycle) then the generated radiation is not necessarily exactly at harmonics of the pump radiation frequency. The substrates may be lithographically patterned substrates. The radiation obtained through the process may also be provided in a lithographic apparatus LA, and/or a lithographic cell LC.

The pump radiation 611 may comprise radiation with one or more wavelengths higher than the one or more wavelengths of the emitted radiation. The pump radiation may comprise infrared radiation. The pump radiation may comprise radiation with wavelength(s) in the range of 500 nm to 1500 nm. The pump radiation may comprise radiation with wavelength(s) in the range of 800 nm to 1300 nm. The pump radiation may comprise radiation with wavelength(s) in the range of 900 nm to 1300 nm. The pump radiation may be pulsed radiation, which may provide high peak intensities for short bursts of time. Pulsed pump radiation may comprise pulses with a duration in the picosecond or femtosecond range.

For some embodiments, the emitted radiation, optionally the high harmonic radiation, may comprise one or more harmonics of the pump radiation wavelength(s). The emitted radiation may comprise wavelengths in the extreme ultra-violet, soft X-Ray, and/or hard X-Ray part of the electromagnetic spectrum. The emitted radiation 613 may comprise wavelengths in one or more of the ranges of less than 1 nm, less than 0.1 nm, less than 0.01 nm, 0.01 nm to 100 nm, 0.1 nm to 100 nm, 0.1 nm to 50 nm, 1 nm to 50 nm and 10 nm to 20 nm.

Radiation, such as high harmonic radiation described above, may be provided as source radiation in a metrology tool MT. The metrology tool MT may use the source radiation to perform measurements on a substrate exposed by a lithographic apparatus. The measurements may be for determining one or more parameters of a structure on the substrate. Using radiation at shorter wavelengths, for example at EUV, SXR and/or HXR wavelengths as comprised in the wavelength ranges described above, may allow for smaller features of a structure to be resolved by the metrology tool, compared to using longer wavelengths (e.g. visible radiation, infrared radiation). Radiation with shorter wavelengths, such as EUVSXR and/or HXR radiation, may also penetrate deeper into a material such as a patterned substrate, meaning that metrology of deeper layers on the substrate is possible. These deeper layers may not be accessible by radiation with longer wavelengths.

In a metrology tool MT, source radiation may be emitted from a radiation source and directed onto a target structure (or other structure) on a substrate. The source radiation may comprise EUVSXR and/or HXR radiation. The target structure may reflect, transmit and/or diffract the source radiation incident on the target structure. The metrology tool MT may comprise one or more sensors for detecting diffracted radiation. For example, a metrology tool MT may comprise detectors for detecting the positive (+1st) and negative (−1st) first diffraction orders. The metrology tool MT may also measure the specular reflected or transmitted radiation (0th order diffracted radiation). Further sensors for metrology may be present in the metrology tool MT, for example to measure further diffraction orders (e.g. higher diffraction orders).

The properties of the emitted radiation used to perform a measurement may affect the quality of the obtained measurement. For example, the shape and size of a transverse beam profile (cross-section) of the radiation beam, the intensity of the radiation, the power spectral density of the radiation etc., may affect the measurement performed by the radiation. It is therefore beneficial to have a source providing radiation that has properties resulting in high quality measurements.

An embodiment of a radiation source may comprise the HHG source 600 in FIG. 7, the pump radiation source and optionally an assembly which may be a pulse compression system. The pump radiation source may comprise a high-power laser source, which may generate radiation pulses with power above 100 W, optionally above 1000 W. The pulse compression system may be placed between the pump radiation source and the HHG source, and it compresses the radiation pulses generated by the pump radiation source in length.

Efficient HHG requires the radiation pulses to be ultra-short optionally with a duration of less than one hundred or a few tens of femtoseconds (fs), because that applications of longer pulses lead to excessive plasma formation, which is detrimental for both achieving a proper phase velocity in the gas target (called phase matching) and preserving a beneficial spatial shape of the pump radiation. Therefore, for HHG source, as well as many other types of radiation source, input radiation may need to be prepared by the pulse compression system. For example, ytterbium lasers operating at 1030 nm, which is one of the lasers showing most potential for rapid scaling up of average power, typically produce radiation pulses of about 0.5 picosecond (ps) duration. Hence the pulse compression system is necessary to compress the radiation pulses optionally by at least a factor 10.

Several types of pulse compression systems exist operating with the same principle: 1) a laser beam is propagated through a nonlinear medium with nonlinear optical properties, which leads to spectral broadening of the laser beam but also to dispersion; 2) the dispersion is cancelled by applying a frequency-dependent delay to the laser beam so that all frequency components of the laser beam overlap in time. Optionally chirped mirrors are used for the frequency-dependent delay in step 2).

Figure 8:
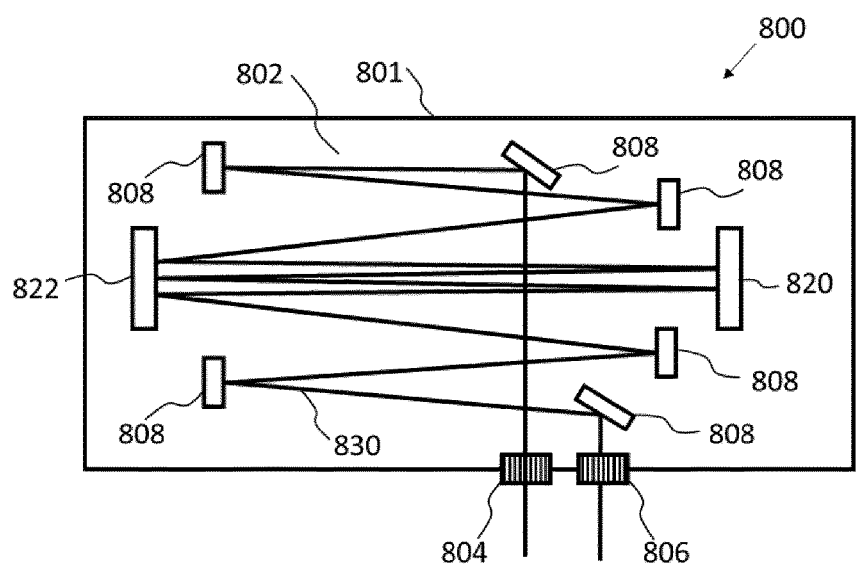
FIG. 8 depicts a schematic drawing of an example of at least part of a multipass cell.

Examples of architectures of step 1) may be a gas-filled capillary, a solid target, or a multipass cell (MPC). The MPC, at least part of which is shown as 800 in FIG. 8, is a good candidate for scaling up to HVM systems due to its high transmission (optionally >90%), which means that only a relatively small amount of laser beam energy is lost and converted into heat in the pulse compression system. For reasons of thermal load and robustness, this may be an essential property if the pulse compression system is to survive in a situation in which the power of the pump radiation is scaled up to kW level or higher.

In the embodiment shown in FIG. 8, the MPC comprises a pressurized chamber 801 filled with a MPC gas 802 with nonlinear optical properties, a radiation beam input 806, a radiation output 804, and optics (808, 820 and 822). Optionally the optics may comprise multiple alignment optics 808, and two opposing reflection mirrors 820 and 822 between which an input radiation beam 830 is circulated many times. Optionally, the optics may further comprise transmissive optics and/or reflective mirror and/or lens, which are not shown in FIG. 8, for transmitting and or reflecting the input radiation beam 830. Note that there are only a few numbers of reflections occurring between two opposing reflection mirrors 820 and 822 in FIG. 8, which is for illustration only while in reality the number of reflections may be above 40 times. Optionally, the input radiation beam 830 has a wavelength within IR region. In one example, the optics, especially two opposing reflection mirrors 820 and 822, are configured such that the input radiation beam 830 is focused near the center of the two opposing reflection mirrors 820 and 822 at each pass, so that a high intensity is created near the center where is a central focusing region of the two opposing reflection mirrors 820 and 822. In one example, the two opposing reflection mirrors 820 and 822 may be cavity mirrors between which the input radiation beam passes many times. At each pass, the nonlinear properties of the MPC gas 802 lead to a small amount of spectral broadening, so that the combined effect of all passes results in a sufficient spectral broadening for pulse compression. The MPC gas may be a noble gas which have the property that it does not easily ionize, so that detrimental formation of plasma is limited. The MPC gas may be for example a noble gas, optionally comprises one or more of Helium (He), Neon (Ne), Argon (Ar), Krypton (Kr), and Xenon (Xe).

A disadvantage of using the MPC is that in operation the optics, and in particular the two opposing reflection mirrors 820 and 822, are exposed to the input radiation beam with a high intensity. A relevant quantity may be fluence, which is defined as pulse energy per unit surface area. Typically values of the fluence are in the range of $J/cm^2$, which is often less than an order of magnitude lower than damage threshold of the optics. In principle a high fluence on the two opposing reflection mirrors 820 and 822 can be reduced by placing them farther away from the high intensity, which may be the central focusing region, but this may make the pulse compression system less compact and also requires usage of large diameter mirrors, both of which drive up cost of the MPC. A compact and competitive design therefore may result in a relatively high fluence. A problem occurring at surfaces of the optics at high fluences is laser-induced contamination (LIC). In one example, volatile hydrocarbons present in the pressurized chamber 801 may deposit on the optics, forming a layer which is optionally a carbon layer. The layer is much more absorbing than good-quality coatings, resulting in a steady decrease of reflectivity over time. Because the MPC may involve many mirror reflections, this leads to a steady decrease of the high intensity of the radiation beam. Typically, a loss of beam power is in a percent per week range when running with the input radiation beam of power in the 100 W order of magnitude, which is an unacceptably large rate of degradation. Apart from the loss of beam power, it is problematic that absorbed power heats up the optics locally at position of the input radiation beam spot, potentially leading to optics damage and input radiation beam instabilities. These severely limit the useability of the input radiation beam, even if the loss of beam power is no more than a few percent.

Several techniques have been developed to mitigate or recover from LIC. A first reference Applied Optics Vol. 60, Issue 3, 533 (2021), which is incorporated herein by reference in its entirety, explores techniques to clean carbon deposition from a mirror surface including applying UV radiation from a mercury lamp to the mirror surface in a chamber filled with atmospheric pressure air. The mechanism is that the UV radiation has sufficiently high photon energy to generate ozone from oxygen in the ambient environment. The ozone generated is a highly reactive molecule which may react with the carbon deposition to further generate volatile oxides, and the further generate volatile oxides may be pumped away. However, the method mentioned in the first reference is not able to clean the mirror surface locally and the UV radiation may illuminate on the other parts of the chamber and cause material degradation.

Hereby we report assembly embodiments which may be used for locally cleaning a surface area of an optical element. A medium, which may be solid or gas, is placed in a space, which may be inside or outside of the pressurized chamber 801. In operation, the solid or gas medium receives a first radiation for generating a second radiation, optionally via a HHG process. Optionally, the second radiation has a shorter wavelength than the first radiation. Optionally, the second radiation propagates coaxially with the first radiation after the medium to impinge on the optical element, which is placed after the medium. Optionally, the optical element is for transmitting or reflecting the first radiation with the surface area. Optionally, in operation, a cleaning gas is in contact with the surface area, and a reactive medium is generated from a part of the cleaning gas by the second radiation for removing a contamination from the surface area.

Figure 9:
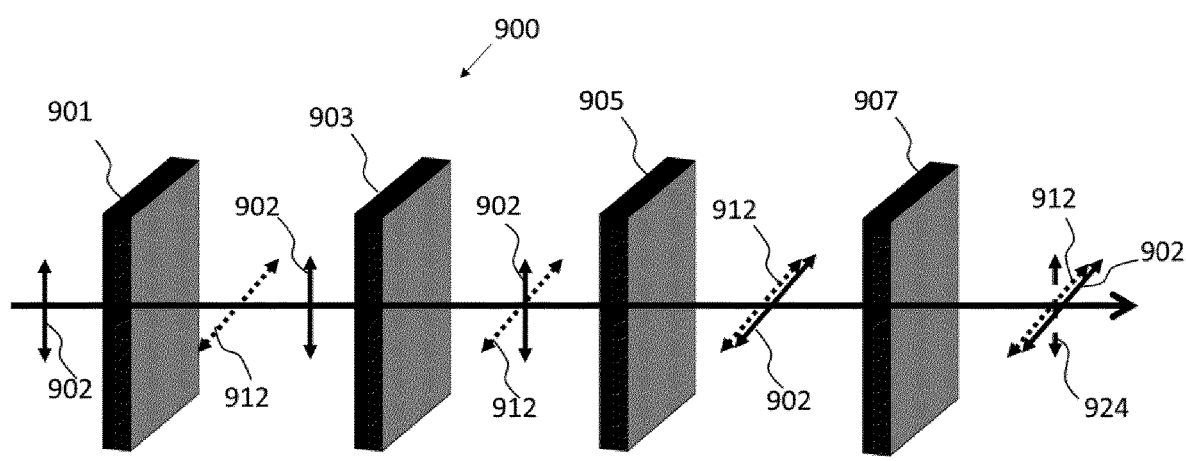
FIG. 9 depicts a schematic drawing of an example of configuration of crystals to generate harmonic radiation.

A harmonic generation assembly 900 is illustrated in FIG. 9, which may be used to generate the second radiation, for example to convert a small part of the input radiation beam 902 into its third harmonic radiation 924 by means of a solid medium. In this embodiment, a fraction of the input radiation beam 902 is first converted to its second harmonic radiation 912 in a first crystal 901, then the second harmonic radiation 912 and the input radiation beam 902 are overlapped by means of a second crystal 903 and a third crystal 905. Subsequently the third harmonic radiation 924 is generated in a fourth crystal 907. The function of the second crystal 903 is to overlap the input radiation beam 902 and the second harmonic radiation 912 on top of each-other and share the same beam path. The second crystal 903 may be a delay compensation plate. The input radiation beam 902 and the second harmonic radiation 912 may gave different propagating speeds inside the second crystal 903 and may overlap in time afterwards. In one embodiment, the third crystal 905 is to rotate polarization of the second harmonic radiation 912 and may not generate any radiation. Optionally the crystals 901 and 907 are Beta Barium Borate (BBO). An advantage of the embodiment 900 is that the conversion efficiency of the third harmonic generation (THG) is relatively high, for example higher than a fourth harmonic generation (FHG).

In one embodiment, the third harmonic radiation 924 is within wavelength range from 100 nm to 260 nm such that it may not be absorbed by the MPC gas and can be used for generating the reactive medium, for example ozone. Optionally, the third harmonic radiation 924 may have a wavelength in the UV range, and optionally the conversion efficiency is in the range of 0.1-10%. For a 100 W laser, it means that a UV beam with a power in 0.1-10 W range may be generated, which is comparable to power of commercially available UV lamps (few watts) used for cleaning, for example the mercury lamp mentioned above. Optionally the second radiation mentioned may have a power within 0.01 to 10 W, optionally 0.01 to 1 W, and optionally 0.01 to 0.1 W. Optionally the third harmonic conversion may be done prior to sending the input radiation beam 902 into the pressurized chamber 801. The result is that, in addition to the input radiation beam 902, the UV beam, which may be of lower intensity and propagating coaxially with the input radiation beam 902 after the assembly 900, is also sent into the pressurized chamber 801. When a certain amount of the cleaning gas, for example oxygen, is present in the pressurized chamber 801 and in contact with the mirror surface, the UV beam may react with the cleaning gas to produce the reactive medium, for example ozone, for cleaning the mirror surface, while the pulses of the input radiation beam 902 may be compressed by the MPC as intended. The benefits of this embodiment in comparison to the existing technique mentioned above, for example the UV lamps, comprise:

1) The UV beam generated with embodiment of FIG. 9 is provided in similar shape of the input radiation beam 902 and is therefore concentrated. In addition, the UV beam co-propagates with the input radiation beam 902 such that it may automatically, exactly, and exclusively irradiate the surface area where the input radiation beam 902 hit the optical element. Thereby, a UV radiation with concentrated intensity is provided precisely where the optical element needs to be cleaned. Compared with using UV lamp, the embodiments in this report enable locally cleaning on the optical element and may not degrade MPC materials, e.g. the inner wall of the pressurized chamber 801.

2) The cleaning process and the pulse compression of the input radiation beam 902 may potentially be performed simultaneously, which means that this method is suitable as an in-line method. In contrast, when using the UV lamp, one may need to stop the input radiation beam, open the pressurized chamber 801, and bring the UV lamp close to the surface area for a sufficiently high cleaning rate.

Figure 10:
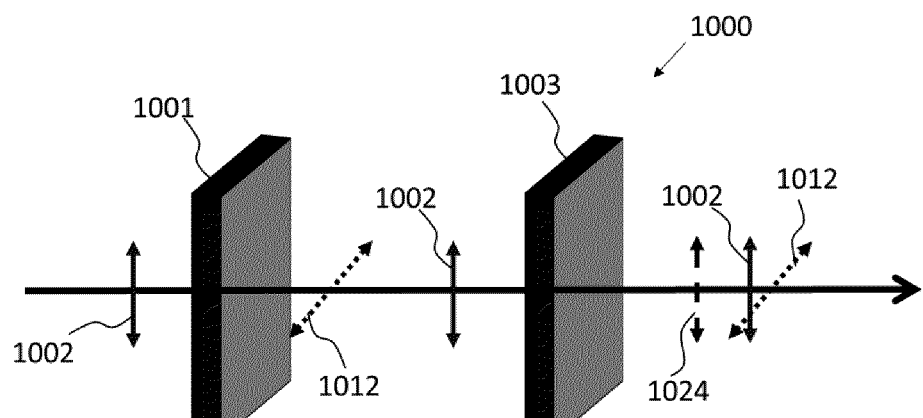
FIG. 10 depicts a schematic drawing of an example of configuration of crystals to generate harmonic radiation.

A harmonic generation assembly 1000 is illustrated in FIG. 10, which may be used to convert a small part of the input radiation beam 1002 to its fourth harmonic radiation 1024 by means of the solid medium. One or more of the features of the embodiment 900 described with respect to FIG. 9, may also be present in the embodiment 1000 as appropriate. In this embodiment 1000, a fraction of the input radiation beam 1002 is first converted to its second harmonic radiation 1012 in a first crystal 1001, then in a second crystal 1003 part of the second harmonic radiation 1012 is converted to the fourth harmonic radiation 1024 of the input radiation beam 1002, which may be a UV radiation.

A benefit of generating the fourth harmonic is that it has a shorter wavelength than the third harmonic, and the more energetic photons are more efficient in generating the reactive medium. In terms of implementation the embodiment 1000 may be easier considering the number of crystals involved. Typical efficiency of the harmonic generation process may be between 5% to 30% when using 200 µm thick BBO crystals, which may generate sufficient UV radiation at the surface area to clean the LIC optionally the hydrocarbons in presence of oxygen. The advantage of BBO over other crystals is its large phase matching bandwidth which facilitates shorter pulses, but all the crystal can in principle be used. Various combinations of different crystals can also be possible.

The crystals in FIG. 9 and FIG. 10 may be any nonlinear crystal which may generate harmonics of the input radiation beam when phase matched. Here is a list of crystals which may be used to generate low order harmonics:

Beta Barium Borate—BBO
Potassium Dideuterium Phosphate and Its Isomorphs—KDP, KD*P (DKDP) Crystals
Lithium Triborate—LBO
Potassium Titanyl Phosphate—KTP Crystals
Cesium Lithium Borate—CLBO Crystals Each crystal may be cut at a particular angle to phase match the input radiation beam and its second, third, fourth or fifth harmonic radiation. Different combinations of crystal may be used as well. For example, when the input radiation beam has a wavelength of 1030 nm, LBO can be used to generate 515 nm radiation and then BBO can be used for generation of 256 nm radiation by frequency doubling the 515 nm radiation. For example, when the input radiation beam has a wavelength of 1030 nm, the first crystal may partially convert the 1030 nm radiation to 515 nm radiation and the second crystal may generate 343 nm radiation. The 343 nm radiation and the 515 nm radiation may be combined on the third crystal to generate a 205 nm radiation.

When the UV radiation is generated upstream of the MPC, it may be difficult for the UL radiation to transmit the radiation beam input 806 which may be made of materials such as fused silica or a comparable material. It is also difficult for the UV radiation to transmit any other optics between the harmonic generation and the surface area that needs to be cleaned. One alternative solution is to use an embodiment in which the harmonic generation assembly, for either THG or FHG, is placed inside the pressurized chamber 801. In one embodiment, the harmonic generation assembly is placed in beam path of the input radiation beam and at a position where it does not significantly affect the spectral broadening operation of the MPC. Such a position may be near the radiation beam input 806 so that the UV radiation is generated upstream the optics to be cleaned. In another embodiment, the harmonic generation assembly is placed on a translation stage that can be moved into the beam path of the input radiation beam during cleaning cycles, and moved out of the beam path during the spectral broadening operation. Optionally the position in the beam path may be between the two opposing reflection mirrors 820 and 822, so there are many passes through the harmonic generation assembly. Consequently a significant amount of UV radiation may be produced, and each bounce on the two opposing reflection mirrors 820 and 822 may be provided with individually generated UV radiation pulses.

A further embodiment is an assembly with a gas medium mixed with the cleaning gas to replace the MPC gas in the pressurized chamber 801 during the cleaning cycles. The gas medium may convert a part of the input radiation beam into its third or fifth or any other harmonic by nonlinear interaction with a suitable gas species at the central focusing region of the MPC. The gas medium may be for example a noble gas, optionally comprises one or more of Neon (Ne), Helium (He), Argon (Ar), Nitrogen ($N_2$), Oxygen ($O_2$), Krypton (Kr), and Xenon (Xe).

Some gases emit a third harmonic radiation when applied to radiation of sufficiently high intensities. A benefit of using the gas medium is that it may be implemented in an MPC without further addition of optical elements. In a second reference R. A. Ganeev et al., "THG in air by use of femtosecond radiation in tight-focusing conditions," Applied Optics 45, 748 (2006), which is incorporated herein by reference in its entirety, efficiency of THG by focusing a laser beam into air has been studied as a function of experimental parameters. It can be deduced that the THG conversion efficiency (CE) scales approximately as $$CE \propto p^2 I^4$$

where p is gas pressure, and I is input radiation beam intensity. The second reference claimed a CE of $1e^{-3}$ at an input radiation beam intensity of $2e^{14}$ W/cm². In an MPC, the intensity in the focal region is lower, typically in the range of a few times $1e^{13}$ W/cm². Given the scaling in the above equation, the CE for THG in MPC would be of the order of $1e^{-7}$, when using air at similar conditions as in the second reference. Note that THG is mentioned only for illustrational while the mechanism works also for other orders of harmonic generations. There are two reasons why the THG with the gas medium in an MPC may be substantially more efficient. First, the second reference suggests that most measurements mentioned are done at pressures between $10^2$ to $10^4$ Pa, whereas the pressure in the MPC is typically multiple bars. Given the pressure scaling in the above equation, the CE in an MPC may be at least one order of magnitude but more probably several orders of magnitude higher. Second, air is not the most optimal medium for THG. For example, Xenon is known for its favourably nonlinear properties. In addition to the scaling in the above equation, the CE for THG scales with the atomic properties according to a third reference H. J. Lehmeier et al., "Nonresonant third order hyperpolarizability of rare gases and N2 determined by THG", Opt. Comm. 56, 67 (1985), which is incorporated herein by reference in its entirety:

$$\eta \propto \left| \frac{\gamma^{(3)}}{n_3 - n_1} \right|^2$$

where $\gamma^{(3)}$ is third order hyperpolarizability of gas, and $n_1$ and $n_3$ are refractive indices of the gas for pump radiation and the third harmonic radiation respectively. Numerator in this equation accounts for the efficiency by which atoms convert the pump radiation. The denominator accounts approximately for the reduction in overall efficiency due to the phase velocity of the pump radiation being higher than that of the generated third harmonic radiation. Using measured values in the third reference for the quantities on the right-hand side of the above equation, the THG efficiency is about 5 times higher for Xenon than for air. This efficiency difference has been confirmed by measurements in the third reference. Therefore, it may be reasonably expected that a THG efficiency of about $1e^{-5}$ to $1e^{-4}$ may be obtained in an MPC when operating in a suitable gas at multi-bar pressure. Similar to embodiment with solid medium, this may result in a UV beam propagating coaxially with the input radiation beam. When a suitable amount of the cleaning gas for example oxygen is mixed with the gas medium, this may lead to cleaning of the optical element by generated reactive medium for example ozone, exactly at the surface area where the input radiation beam hits the optical element.

Besides oxygen, other materials in gas phase may also work as the cleaning gas. For example, the cleaning gas may comprise one or more of $H_2O$, $NO_2$, $CO_2$, $H_2O_2$, and $H_2$. During reaction process, $NO_2$, $CO_2$ may part with O to turn into gaseous NO and CO. $H_2O_2$ may part with O even easier, have higher dew point than $H_2O$, spend more time in gas than absorbed on inner wall of the pressurized chamber 801, and help to oxidize $C_xH_y$ before it deposits. $H_2$ may generate sufficient amount of $H^*$ for removing LIC. Oxygen is just used as an example for illustration in the report. By mole fraction, the cleaning gas in the MPC gas is less than 10%, optionally less than 5%, optionally less than 1% and optionally less than 0.1%.

Compared with the embodiments with gas medium, the solid medium may be damaged by the input radiation beam with high power, cause unwanted reflection, and cause beam deformation. An advantage of the solid-medium embodiments is that UV radiation with higher power may be generated. A disadvantage of the gas-medium embodiments is that it may require separate cleaning cycles during which the pressurized chamber 801 is flushed with the gas medium and oxygen mixture, and the normal operation of the MPC may be interrupted. In the solid-medium embodiments both MPC operation and cleaning cycles may potentially be performed simultaneously.

A further embodiment is an assembly with gas medium mixed with the MPC gas 802 or replacing the MPC gas with the gas medium. In this embodiment there is no gas change between the MPC gas during normal operation (spectral broadening) and the gas medium mixed with the cleaning gas during the cleaning cycles (THG), but the pressurized chamber 801 is filled with a trade-off mixture that leads to sufficient spectral broadening while also leads to a low but steady level of THG for LIC cleaning. Optionally, the majority of the trade-off mixture may be the MPC gas, and the trade-off mixture comprises small amount of cleaning gas with sufficiently low concentrations so as not to disturb the spectral broadening operation. Therefore content of the cleaning gas should be high enough to lead to sufficiently high cleaning rates, but low enough so as not to adversely affect the spectral broadening operation of the input radiation beam, which is primary function of the MPC. Too much cleaning gas may etch components of the MPC and the partial pressure of cleaning gas may need to be within a certain region to have sufficient cleaning while avoid unwanted etching. For example, the trade-off mixture inside the pressurized chamber may have a pressure of 100 mbar to tens of bars and the oxygen in the gas mixture is less than 10%, optionally less than 5%, optionally less than 1% and optionally less than 0.1%. A benefit of this embodiment is that the cleaning takes place constantly during the spectral broadening operation, optionally at a low rate. The effect can be that the LIC build-up on the surface area is prevented and the optical element stays clean.

Figure 11:
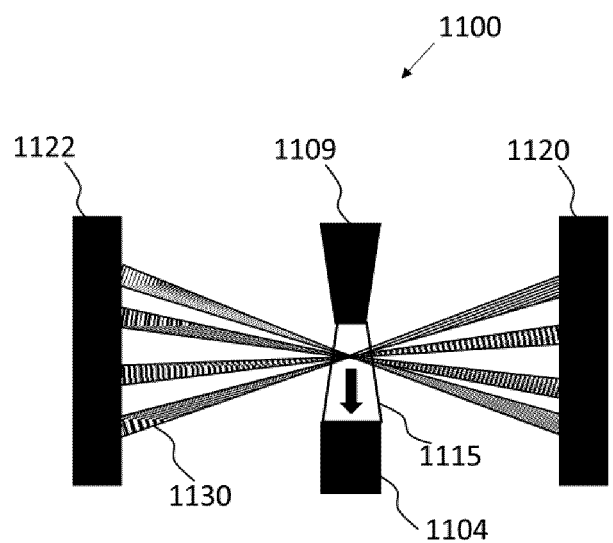
FIG. 11 depicts a schematic drawing of an example of an assembly with a gas nozzle.

A further embodiment comprises an assembly 1100 as show in FIG. 11. The assembly 1100 may be used for harmonic generation for LIC cleaning, optionally a third or fifth harmonic of an input radiation beam 1130. The input radiation beam 1130 may be one example of the input radiation beam 830 in FIG. 8. The assembly 1100 comprises two opposing reflection mirrors 1122 and 1120 between which the input radiation beam 1130 is circulated many times. The two opposing reflection mirrors 1122 and 1120 may be one example of the two opposing reflection mirrors 820 and 822 in FIG. 8. The assembly 1100 may further comprise a gas nozzle 1109 which may be one example of the gas nozzle 609 in FIG. 7. The gas nozzle may be placed close to the central focusing region as mentioned above and may deliver a gas flow 1115, which may be one example of the gas flow 615 shown in FIG. 7. Optionally the gas flow has a flow direction indicated by an arrow. Optionally a gas catcher 1104 is in the flow direction and close to the gas nozzle 1109 to draws gas molecules. The gas catcher 1104 is optional and embodiments without the gas catcher 1104 exist. The gas nozzle 1109 may provide the gas flow with a high pressure from which the low order harmonics, e.g. the third or fifth harmonic, are generated. The efficiency of the harmonic generation process may be in the range of $10^{-5}$ to $10^{-2}$. In an MPC, intensity of UV radiation generate by 4 bars of Ar may be sufficient to clean the optics in presence of the cleaning gas, optional oxygen. This embodiment enables to generate UV radiation with even higher intensity than the above-mentioned embodiments with gas medium and enables to generate UV radiation from a gas medium i.e. the gas flow 1115 which may be a different gas than the MPC gas. This embodiment 1100 may be implemented in the MPC (or part of an MPC) 800 or any other assembly suitable for harmonic generation or with two opposing reflection mirrors. In one embodiment, the assembly is inside a cell which is filled with a cell gas and the gas flow has the same gas as the cell gas. In one embodiment, the assembly is inside a cell which is filled with a cell gas and the gas flow has a different gas than the cell gas.

The above-mentioned embodiments rely on harmonic generation by the input radiation beam itself, thereby avoiding introduction of external cleaning equipment such as UV lamps or plasma generators into the MPC and only targeting LIC locally at the surface area where the input radiation beam hits the optical element. These embodiments may therefore be cheaper and more efficient than the existing technologies.

Although the third, fourth and fifth harmonic generation have been mentioned in the above texts, it should be understood that the harmonic orders described are just illustrational. It will be appreciated that the invention is not limited to any specific harmonic orders.

In an embodiment to prevent LIC optionally the hydrocarbons deposition, a cold finger is placed inside a gas cell. An operational principle of the cold finger is that molecules inside a vacuum cell may stick to surface of the cold finger when hitting it, so that the molecules are on the surface of the cold finger and the vacuum inside the vacuum cell improves. When pressure of the gas cell is low, the molecules may coincidentally hit the surface of the cold finger while when the pressure is high, a flow may be generated to direct the molecules to the surface and get adsorbed. In the gas cell, the cold finger may be a piece of material with lower temperature than inner wall of the gas cell or with lower temperature than gas inside the gas cell. In this embodiment, the goal is not to remove the molecules, but to remove the contaminations which may cause the LIC from the gas inside the gas cell before they deposit on the optical elements, while leaving the gas unaffected. Optionally the gas cell is the pressurized chamber 801 and the gas inside the gas cell is the MPC gas 802.

Residence time of the molecule on the surface increases with decreasing temperature of the surface of the cold finger. A longer residence time may lower partial pressure of the molecules in the gas cell. Besides the residence time, another aspect which decide how well the cold finger works is whether a molecule of a certain gas sticks to the cold finger or not, which is controlled by a material property its vapour pressure. Every material has a temperature dependent vapour pressure. For example, for water this pressure is 1 bar when the temperature is 100 degree, so under normal circumstances water boils at the temperature. However, when ambient pressure is lower water molecules can escape from the liquid easier, and water boils at a lower temperature. At 20 degree the water vapour pressure has dropped to 24 mbar, and at 125 K almost to zero. A similar story holds for the contaminations e.g. hydrocarbons on steel. When temperature of the steel is low, hydrocarbons that are sticking on surface of the steel may not have enough energy to overcome the adsorption energy. Therefore once the molecules or contaminations are sticked on the surface of the cold finger they may not escape.

Some gases, for example some light noble gasses and hydrogen have high vapour pressures even at low temperatures. Therefore when a cold finger is placed into a gas cell with a high pressure light noble gas or hydrogen, the light noble gasses or hydrogen may still keep at a high pressure but other molecules for example the contaminations may be collected by the cold finger. For example, for Argon the vapour pressure is above 3 bar when the temperature is above roughly −175 degree. In other words, in an MPC filled with 3 bars of Argon, the cold finger may be operated down to temperatures of −175 degree without causing any unwanted argon condensation. Similarly, the cold finger may be operated down to cryogenic temperatures in most of the noble gases at a few bars pressure.

The cold finger mentioned above may be implemented separately or combined with the other embodiments, for example the embodiments for removing the contamination from the surface area of the optical element with gas medium or solid medium.

The above-mentioned embodiments may be used for MPC integrated with capillary, supercontinuum light source and lithographic apparatus optionally using EUV radiation. The above-mentioned embodiments may also be used for cleaning optical element for example windows in capillary structure, optionally capillary for HHG. The above-mentioned embodiments may also be used for supercontinuum light source optics cleaning and optical element cleaning of the lithographic apparatus optionally using EUV radiation source. The above-mentioned embodiments may be used for any apparatus or system comprising an optical element and a radiation beam in operation.

The illumination source may be provided in for example a metrology apparatus MT, an inspection apparatus, a lithographic apparatus LA, and/or a lithographic cell LC.

All the above-mentioned embodiments may be used in methods for removing a contamination form a surface area of an optical element. A first step is inputting a first radiation, for example the input radiation beam, into a medium to generate a second radiation, optionally via an HHG. Optionally the second radiation propagates coaxially with the first radiation and impinges onto the surface area of the optical element after the medium. Optionally, the surface area of the optical element transmits or reflects the first radiation. A second step is providing a cleaning gas in contact with the surface area and a third step is generating a reactive medium from at least a part of the cleaning gas by the second radiation for removing the contamination from the surface area. The methods may comprise any of the features described in any of the above-mentioned embodiments if applicable.

In another embodiment, there is a non-transitory computer program product comprising machine-readable instructions therein. The instructions, upon execution by a computer system, is configured to cause the computer system to at least cause performance of the method of any of the above-mentioned embodiments.

Further embodiments are disclosed in the subsequent numbered clauses:

1. An assembly comprising
    A space configured for placing a medium to receive a first radiation for generating a second radiation such that, in operation, the second radiation propagates coaxially with the first radiation after the medium;
    and an optical element after the medium for transmitting or reflecting the first radiation with a surface area,
    wherein the assembly is configured such that, in operation, a cleaning gas is in contact with the surface area, and
    wherein a reactive medium is generated from at least a part of the cleaning gas by the second radiation for removing a contamination from the surface area.
2. An assembly according to clause 1, wherein the medium is a gas medium.
3. An assembly according to clause 2, wherein the gas medium comprises one or more of Neon, Helium, Argon, Nitrogen, Oxygen, Krypton, and Xenon.
4. An assembly according to clause 1, wherein the medium is a solid medium.
5. An assembly according to clause 4, wherein the solid medium comprises a nonlinear crystal.
6. An assembly according any of the preceding clauses, wherein the cleaning gas comprises one or more of $O_2$, $H_2O$, $NO_2$, $CO_2$, $H_2O_2$, and $H_2$, and optionally by mole fraction, the cleaning gas in the gas medium and the cleaning gas mixture is less than 10%, optionally less than 5%, optionally less than 1% and optionally less than 0.1%.
7. An assembly according to any of the preceding clauses, wherein the first radiation has a first wavelength within infrared range.
8. An assembly according to any of the preceding clauses, wherein the second radiation has a second wavelength within 100 nm to 260 nm range.
9. An assembly according to any of the preceding clauses, wherein the second radiation has a power within 0.01 to 10 W.
10. An assembly according to any of the preceding clauses, wherein the assembly is configured to compress a pulse of the first radiation.
11. An assembly according to any of the preceding clauses, wherein the contamination is a laser-induced contamination, optionally a carbon layer.
12. An assembly according to any of the preceding clauses, wherein the second radiation is generated via a third, fourth or fifth harmonic generation process.
13. An assembly according to any of the preceding clauses, wherein the assembly is a multipass cell.

14. An assembly according to any of the preceding clauses, wherein the optical element is a mirror and/or lens.
15. An assembly according to any of the preceding clauses, further comprises a cold finger.
16. An assembly according to any of clauses 2 to 15, further comprises a gas nozzle to deliver a gas flow as the gas medium.
17. An assembly according to clause 16, wherein the gas nozzle is placed close to a central focusing region of two opposing reflection mirrors.
18. An assembly according to clause 16 or 17, further comprises a gas catcher to draws gas molecules of the gas flow.
19. An assembly according to any of clauses 16 to 18, wherein the assembly is inside a cell which is filled with a cell gas and wherein the gas flow has a different gas than the cell gas.
20. A radiation source, comprising
A pump radiation source,
the assembly according to any of clauses 1-19, and
a high harmonic generation source,
wherein the assembly is placed in between the pump radiation source and the high harmonic generation source to compress a pulse of the first radiation generated by the pump radiation source.
21. A radiation source according to clause 20, wherein the pump radiation source is an ytterbium laser, optionally operating at 1030 nm.
22. A metrology apparatus comprising an assembly according to any of clauses 1-19 or a radiation source according to clause 20 or 21.
23. A lithographic apparatus comprising an assembly according to any of clauses 1-19 or a radiation source according to clause 20 or 21.
24. A lithographic cell comprising an assembly according to any of clauses 1-19 or a radiation source according to clause 20 or 21.
25. A method comprising
Inputting a first radiation into a medium to generate a second radiation such that the second radiation propagates coaxially with the first radiation after the medium and impinges onto a surface area of an optical element after the medium,
Wherein the surface area of the optical element transmits or reflects the first radiation,
providing a cleaning gas in contact with the surface area, and
generating a reactive medium from at least a part of the cleaning gas by the second radiation for removing a contamination from the surface area.
26. A method according to clause 25, wherein the medium is a gas medium.
27. A method according to clause 26, wherein the gas medium comprises one or more of Neon, Helium, Argon, Nitrogen, Oxygen, Krypton, and Xenon.
28. A method according to clause 25, wherein the medium is a solid medium.
29. A method according to clause 28, wherein the solid material comprises a nonlinear crystal.
30. A method according any of clauses 25 to 29, wherein the cleaning gas comprises one or more of $O_2$, $H_2O$, $NO_2$, $CO_2$, $H_2O_2$, and $H_2$, and optionally by mole fraction, the cleaning gas in the gas medium and the cleaning gas mixture is less than 10%, optionally less than 5%, optionally less than 1% and optionally less than 0.1%.
31. A method according any of clauses 25 to 30, wherein the first radiation has a first wavelength within infrared range.
32. A method according to any of clauses 25 to 31, wherein the second radiation has a second wavelength within 100 nm to 260 nm range.
33. A method according to any of clauses 25 to 32, wherein the second radiation has a power within 0.01 to 10 W.
34. A method according to any of clauses 25 to 33, further comprising compressing a pulse of the first radiation.
35. A method according any of clauses 25 to 34, wherein the contamination is a laser-induced contamination, optionally a carbon layer.
36. A method according to any of clauses 25 to 35, wherein the second radiation is generated via a third, fourth or fifth harmonic generation process.
37. A method according to any of clauses 25 to 36, wherein the assembly is a multipass cell.
38. A method according to any of clauses 25 to 37, wherein the optical element is a mirror and/or lens.
39. A non-transitory computer program product comprising machine-readable instructions therein, the instructions, upon execution by a computer system, configured to cause the computer system to at least cause performance of the method of any of the clauses 25 to 38.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments in the context of a lithographic apparatus, embodiments may be used in other apparatus. Embodiments may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference may be made in this text to embodiments in the context of an inspection or metrology apparatus, embodiments may be used in other apparatus. Embodiments may form part of a mask inspection apparatus, a lithographic apparatus, or any apparatus that measures or processes an object such as a wafer (or other substrate) or mask (or other patterning device). The term "metrology apparatus" (or "inspection apparatus") may also refer to an inspection apparatus or an inspection system (or a metrology apparatus or a metrology system). E.g. the inspection apparatus that comprises an embodiment may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch of the metrology targets may be close to the resolution limit of the optical system of the scatterometer or may be smaller, but may be much larger than the dimension of typical non-target structures optionally product structures made by lithographic process in the target portions C. In practice the lines and/or spaces of the overlay gratings within the target structures may be made to include smaller structures similar in dimension to the non-target structures.

While specific embodiments have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference is made to HXR, SXR and EUV electromagnetic radiations, it will be appreciated that the invention, where the context allows, may be practiced with all electromagnetic radiations, includes radio waves, microwaves, infrared, (visible) light, ultraviolet, X-rays, and gamma rays.

While specific embodiments have been described above, it will be appreciated that one or more of the features in one embodiment may also be present in a different embodiment and that features in two or more different embodiments may also be combined.

The invention claimed is:

1. An assembly comprising:
   a space configured for placing a medium to receive a first radiation for generating a second radiation such that, in operation, the second radiation propagates coaxially with the first radiation after the medium; and
   an optical element after the medium for transmitting or reflecting the first radiation with a surface area,
   wherein the assembly is configured such that, in operation, a cleaning gas is in contact with the surface area, and
   wherein a reactive medium is generated from at least a part of the cleaning gas by the second radiation for removing a contamination from the surface area.

2. The assembly of claim 1, wherein the medium is a gas medium.

3. The assembly of claim 2, wherein the gas medium comprises one or more of Neon, Helium, Argon, Nitrogen, Oxygen, Krypton, and Xenon.

4. The assembly of claim 1, wherein the medium is a solid medium.

5. The assembly of claim 4, wherein the solid medium comprises a nonlinear crystal.

6. The assembly of claim 1, wherein the cleaning gas comprises one or more of $O_2$, $H_2O$, $NO_2$, $CO_2$, $H_2O_2$, and $H_2$.

7. The assembly of claim 6, wherein by mole fraction, the cleaning gas in the gas medium and the cleaning gas mixture is less than 10%, less than 5%, less than 1%, or less than 0.1%.

8. The assembly of claim 1, wherein the second radiation has a second wavelength within a 100 nm to 260 nm range.

9. The assembly of claim 1, wherein the assembly is configured to compress a pulse of the first radiation.

10. The assembly of claim 1, wherein the contamination is a laser-induced contamination or carbon.

11. The assembly of claim 1, wherein the second radiation is generated via a third, fourth, or fifth harmonic generation process.

12. The assembly of claim 1, further comprising a cold finger.

13. A radiation source, comprising:
    a pump radiation source,
    the assembly of claim 1, and
    a high harmonic generation source,
    wherein the assembly is placed in between the pump radiation source and the high harmonic generation source to compress a pulse of the first radiation generated by the pump radiation source.

14. A method comprising:
    inputting a first radiation into a medium to generate a second radiation such that the second radiation propagates coaxially with the first radiation after the medium and impinges onto a surface area of an optical element after the medium, wherein the surface area of the optical element transmits or reflects the first radiation;
    providing a cleaning gas in contact with the surface area; and
    generating a reactive medium from at least a part of the cleaning gas by the second radiation for removing a contamination from the surface area.

15. The non-transitory computer program product comprising machine-readable instructions therein, the instructions, upon execution by a computer system, configured to cause the computer system to at least cause performance of the method of claim 14.

* * * * *